United States Patent [19]
Kinoshita et al.

[11] Patent Number: 5,279,984
[45] Date of Patent: Jan. 18, 1994

[54] METHOD FOR PRODUCING A SEMICONDUCTOR INTEGRATED CIRCUIT DEVICE IN WHICH CIRCUIT FUNCTIONS CAN BE REMEDIED OR CHANGED

[75] Inventors: Mitsuya Kinoshita; Kazutami Arimoto; Kiyohiro Furutani, all of Hyogo, Japan

[73] Assignee: Mitsubishi Denki Kabushiki Kaisha, Tokyo, Japan

[21] Appl. No.: 45,161

[22] Filed: Apr. 12, 1993

Related U.S. Application Data

[60] Division of Ser. No. 915,384, Jul. 20, 1992, Pat. No. 5,223,735, which is a continuation of Ser. No. 652,357, Feb. 6, 1991, abandoned, which is a continuation of Ser. No. 409,847, Sep. 20, 1989, abandoned.

[30] Foreign Application Priority Data

Sep. 30, 1988 [JP] Japan .................. 63-248354

[51] Int. Cl.⁵ ................ H01L 21/70; H01L 27/00
[52] U.S. Cl. .................... 437/52; 437/195; 437/922
[58] Field of Search .............. 437/922, 52, 47, 41, 437/51, 195; 257/529, 530

[56] References Cited

U.S. PATENT DOCUMENTS

| | | |
|---|---|---|
| 3,959,047 | 5/1976 | Alberts et al. . |
| 4,219,827 | 8/1980 | Kaisa . |
| 4,437,107 | 3/1984 | Jonsson et al. . |
| 4,455,567 | 6/1984 | Lee et al. . |
| 4,570,331 | 2/1986 | Eaton, Jr. et al. . |
| 4,581,628 | 4/1986 | Miyauchi et al. . |
| 4,598,462 | 7/1986 | Chandrasekhar . |
| 4,641,286 | 2/1987 | Shimotori et al. . |
| 4,682,204 | 7/1987 | Shiozaki et al. . |
| 4,748,491 | 5/1988 | Takagi . |
| 4,757,359 | 7/1988 | Chiao et al. . |
| 4,795,720 | 1/1989 | Kawanabe et al. ........... 257/529 |
| 4,814,853 | 3/1989 | Uchida . |
| 4,853,758 | 8/1989 | Fischer . |
| 4,864,379 | 9/1989 | Schade, Jr. . |
| 4,881,106 | 11/1989 | Barron . |
| 4,893,167 | 1/1990 | Boudou et al. . |
| 4,984,054 | 1/1991 | Yamada et al. ............. 257/529 |
| 5,025,300 | 6/1991 | Billig et al. . |
| 5,067,000 | 11/1991 | Eimori et al. . |

FOREIGN PATENT DOCUMENTS

| | | |
|---|---|---|
| 56-99406 | 6/1981 | Japan . |
| 58-183837 | 9/1983 | Japan . |
| 60-35534 | 2/1985 | Japan . |
| 60-76140 | 4/1985 | Japan . |
| 62-162353 | 1/1986 | Japan . |

OTHER PUBLICATIONS

Semiconductor World (Jun. 1983), pp. 82–85.
Scribner, "Noise Isolation by Field Shield Segmentation", *IBM TDB*, vol. 18, No. 11 (Apr. 1976), p. 3589.
Blose et al, "Unique Field Plate for an IC Transistor", *IBM TDC*, vol. 22, No. 9 (Feb. 1980), pp. 4030–4031.
Wu, "Personlizable Semiconductor Device with Diffusion for Preventing Short Circuit From Laser Weld", *IBM*, vol. 23, No. 6 (Nov. 1980), p. 2336.

*Primary Examiner*—Olik Chaudhuri
*Assistant Examiner*—H. Jey Tsai
*Attorney, Agent, or Firm*—Lowe, Price, LeBlanc & Becker

[57] ABSTRACT

A semiconductor integrated circuit device in which circuit functions can be remedied or changed by severing at least a portion of a circuit pattern and a method for producing such semiconductor integrated circuit device. The circuit pattern is formed on the semiconductor substrate. A field shield plate is formed on the major surface of the semiconductor substrate for electrically separating respective elements constituting the circuit. The circuit pattern includes a fuse element. The fuse element is provided on the field shield plate. The portion of the field shield plate lying directly below the fuse element is isolated from other portions of the field shield plate. In such semiconductor integrated circuit device, the portion of the field shield plate lying directly below the fuse element is separated from other portions of the field shield plate, so that short-circuiting between the semiconductor substrate and the field shield plate cannot occur even when the laser beam is irradiated with a laser beam deviation at the time of severing of the fuse element.

2 Claims, 10 Drawing Sheets

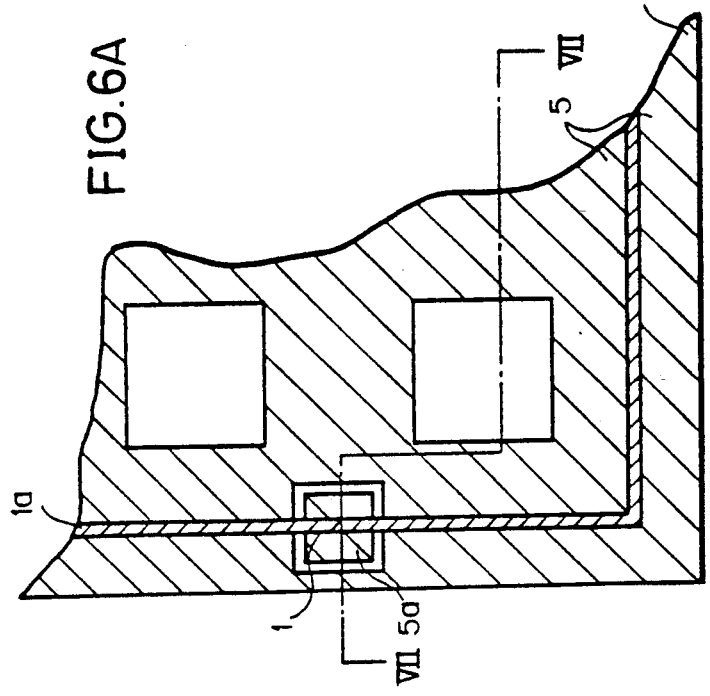
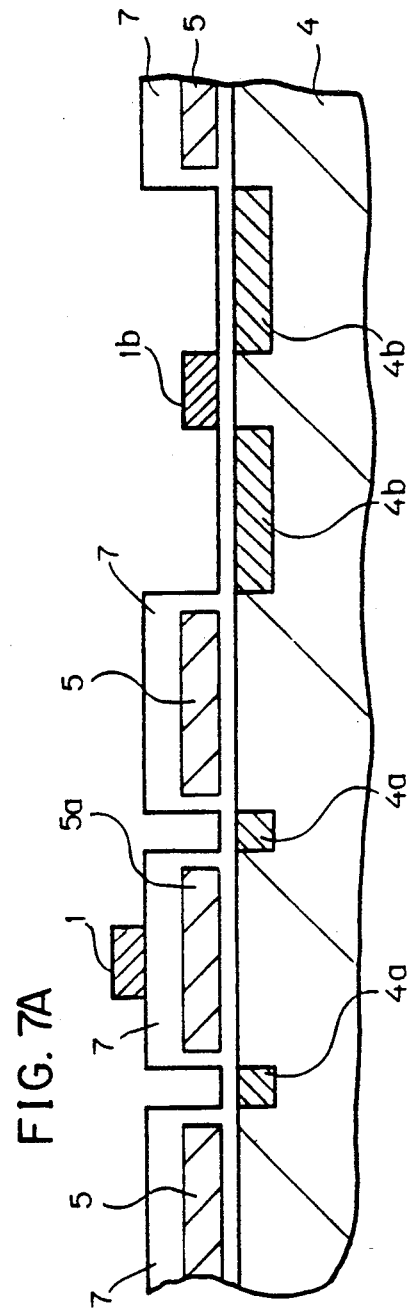

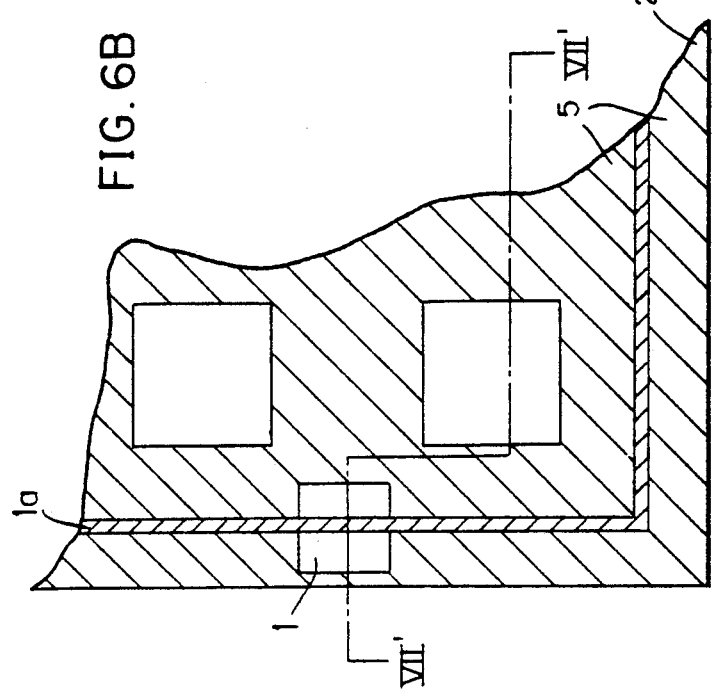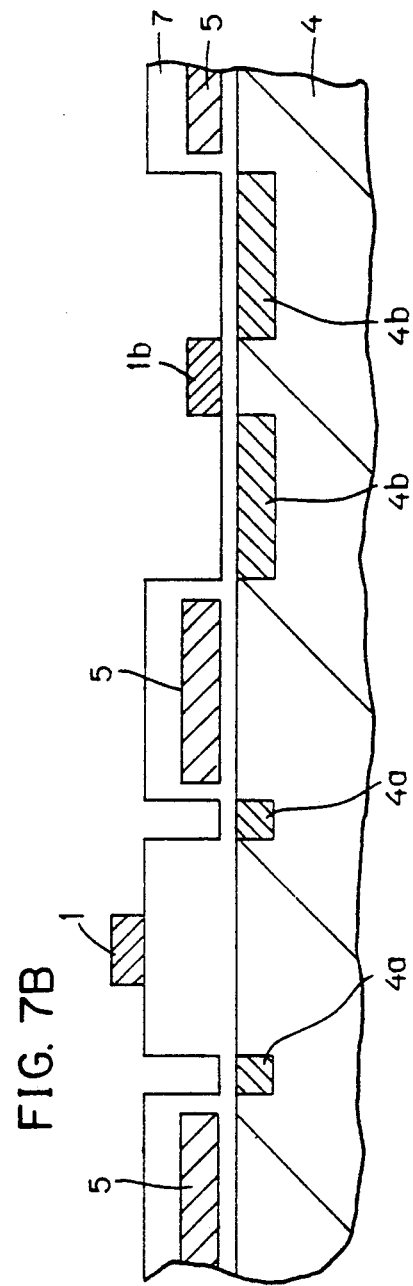

ically conductive material for electrically separating the elements from one another. A pattern wiring 1a and a fuse element 1 are formed on the field shield plate 5 by way of an insulating film 7. The field shield plate 5 is grounded. It is noted that, in FIG. 3, the elements such as MOS transistors or the pattern wiring other than pattern wiring 1a are not shown for clarity.

METHOD FOR PRODUCING A SEMICONDUCTOR INTEGRATED CIRCUIT DEVICE IN WHICH CIRCUIT FUNCTIONS CAN BE REMEDIED OR CHANGED

This application is a divisional of application Ser. No. 07/915,384, filed Jul. 20, 1992, now U.S. Pat. No. 5,223,735 is a continuation of application Ser. No. 07/652,357, now abandoned, filed Feb. 6, 1991, which is a continuation of application Ser. No. 07/409,847, now abandoned, filed Sept. 20, 1989.

BACKGROUND OF THE INVENTION

1. Field of the Invention

This invention relates in general to a semiconductor integrated circuit device and, more particularly, to a semiconductor integrated circuit device in which circuit functions can be remedied or changed. More particularly, it relates to a method for producing such semiconductor integrated circuit device.

2. Description of the Background Art

In a semiconductor integrated circuit, there is known a technique called laser remedying as shown for example in the U.S. Pat. No. 4,641,286, according to which at least one portion of the circuit patterns is severed by irradiation of a laser beam, in order that, when a malfunction occurs in a portion of the circuit on account of defects produced during manufacture or some other reason, the function of the defective circuit may be performed by a built-in redundant circuit.

It is also widely known to sever at least a portion of the circuit pattern of the semiconductor integrated circuit by radiation of the laser beam with a view to changing the function of the semiconductor integrated circuit device.

An example of such severing of the circuit pattern by the laser beam radiation in the MOS type semiconductor integrated circuit, referred to hereinafter as MOS IC, is shown in FIGS. 1A, 1B and 1C. In these figures, that portion of the circuit pattern on the semiconductor substrate 2 of the MOS IC which is assumed to be severed, referred to hereinafter as fuse element 1, is shown to an enlarge scale. FIG. 1A shows the vicinity of the fuse element prior to irradiation of the laser beam. FIG. 1B shows the vicinity of the fuse element after the fuse element is severed by the laser beam in a regular manner. FIG. 1C shows the vicinity of the fuse element when the laser beam is irradiated with a laser beam deviation due to errors or some other reason.

In FIGS. 2A, 2B and 2C, there is shown an example of a fuse element in a MOS IC in which the elements on the MOS IC are electrically separated from one another by a thick oxide film called a LOCOS oxide film. LOCOS is an abbreviation for local oxidation of silicon. FIGS. 2A, 2B and 2C are cross sectional views corresponding to FIGS. 1A, 1B, 1C and taken along line II—II in these figures.

Referring to FIG. 2A, a thick oxide film 3 is formed on the major surface of a P-type semiconductor substrate 4, and a fuse element 1 is formed on this thick oxide film 3. It is well known that, when a laser beam is irradiated with a laser beam deviation, in the LOCOS type MOS IC, no damages are done to the P-semiconductor substrate 4 because the fuse element 1 is formed on the thick oxide film 3. However, in the LOCOS type MOS IC, a so-called bird's beak is formed, as shown at l in FIG. 2A, due to intrusion of the thick oxide film to an unnecessary region, so that a useful area on the P-type semiconductor substrate 4 is taken up wastefully. This represents a considerable hindrance to miniaturization of the circuit of the MOS IC. There is also presented another problem in the LOCOS type MOS IC in that a step difference as shown at h in FIG. 2A is formed on the surface of the thick oxide film 3 and the surface of the P-type semiconductor substrate 4, so that the surface of the MOS IC cannot be flattened to raise difficulties in forming the pattern wiring on the MOS IC surface.

For obviating the above inconvenience, there is also proposed a MOS IC in which the elements on the MOS IC are separated from one another by a gate-separating structure. The theoretical background of such gate-separating structure is explained hereinbelow. When a gate electrode is grounded in an N-type MOS transistor, the source and the drain of the N-type MOS transistor are electrically separated from each other. Similarly, when a potential exceeding the threshold voltage is applied to the gate electrode of the P-type MOS transistor, the source and the drain of the P-type MOS transistor are electrically separated from each other. Hence, in a MOS IC, a layer of an electrically conductive material, called a field shield plate, having a structure similar to that of the gate electrode of the MOS transistor, may be formed in regions of the MOS IC other than regions reserved for capacitors or active elements, such as MOS transistors, and a potential can be applied to this field shield plate to effect the electrical separation of the device of the MOS IC. Such structure is called the gate-separating structure and disclosed in, for example, the Japanese Patent Laying-Open No. 162353/1987.

FIG. 3 is partial plan view of the MOS IC having the gate-separating structure. FIG. 4 is a cross-sectional view taken along line IV—IV in FIG. 3. Referring to these figures, regions 6 for active elements, in which capacitors or active elements such as MOS transistor 21, are to be formed subsequently, are formed on the major surface of the P-type semiconductor substrate. The regions other than the regions 6 for active elements are covered by a field shield plate 5. The field shield plate 5 is a layer of an electrically conductive material for electrically separating the elements from one another. A pattern wiring 1a and a fuse element 1 are formed on the field shield plate 5 by way of an insulating film 7. The field shield plate 5 is grounded. It is noted that, in FIG. 3, the elements such as MOS transistors or the pattern wiring other than pattern wiring 1a are not shown for clarity.

An example of servering of the fuse element 1 by the laser beam irradiation in FIG. 3 is shown in FIGS. 5A, 5B and 5C which are cross-sectional views corresponding to FIG. 1A, FIG. 1B and 1C respectively. Referring to these figures, a negative potential VBB is applied to the P-type semiconductor substrate 4, while the field shield plate 5 is grounded. With this system, defects such as those shown in FIG. 2A by l or h may be eliminated. However, the sum of the thickness of the filed shield plate 5 and that of the insulating film 7 is less than the thickness of the thick oxide film 3. Hence, as shown in FIG. 5C, when the laser beam is irradiated with a laser beam deviation, the field shield plate 5 and the P-type semiconductor substrate 4 are short-circuited to result in short-circuiting of the ground potential and the VBB potential. Therefore, the system is poor in operation reliability structurally. Meanwhile, in such MOS IC having the gate separating structure, when the thick oxide film 3 is also provided on a portion of the MOS IC, the fuse element 1 may be provided on this thick oxide film 3 to avoid the above problem. However, in such a case, the fuse element 1 may be provided only at restricted portions on the LOCOS oxide film so that limitations are necessarily imposed on the layout of the circuit pattern.

SUMMARY OF THE INVENTION

It is therefore an object of the present invention to provide a semiconductor integrated circuit device of the gate-separating structure in which the functions of the circuit can be remedied or changed.

It is another object of the present invention to provide a semiconductor integrated circuit device of the gate-separating structure having high reliability structurally.

It is a further object of the present invention to provide a semiconductor integrated circuit device having the gate-separating structure having a higher degree of freedom in the layout of the circuit pattern.

It is a further object of the present invention to provide a semiconductor integrated circuit device of the gate-separating structure in which the degree of integration can be enhanced and the surface of the semiconductor substrate can be flattened.

It is a further object of the present invention to provide a semiconductor integrated circuit device of the gate-separating structure which is improved in such a manner that the semiconductor substrate or the field shield plate are not short-circuited even when the laser beam is irradiated with a laser beam deviation for servering the fuse element.

It is still another object of the present invention to provide a method for producing the semiconductor integrated circuit device of the gate-separating structure in which the circuit functions can be remedied or changed by servering at least a portion of the circuit pattern.

For accomplishing the above objects, the semiconductor integrated circuit device of the present invention includes a semiconductor substrate having a major surface, a circuit pattern formed on the major surface of the semiconductor substrate, a field shield plate provided on the major surface of the semiconductor substrate for electrically separating respective elements constituting said circuit, and a fuse element, which is a portion of said circuit pattern which is assumed to be severed. The fuse element is provided on the field shield plate. A portion of said field shield plate lying directly below said fuse element is isolated from other portions of the field shield plate.

The semiconductor integrated circuit device according to another aspect of the present invention includes a semiconductor substrate having a major surface, a circuit pattern formed on the major surface of said semiconductor substrate, a field shield plate provided on the major surface of said semiconductor substrate for electrically separating respective elements constituting said circuit, and a fuse element, which is a portion of said circuit pattern which is assumed to be severed. The fuse element is provided on the field shield plate. A portion of the field shield plate lying directly below the fuse element is selectively removed.

In a method for producing the semiconductor integrated circuit device according to a further aspect of the present invention, a thin oxide film is formed on the major surface of the semiconductor substrate. An electrically conductive layer, which is to be a field shield plate, is formed on the oxide film. The electrically conductive layer is patterned so that an opening is formed at a portion thereof which is to be a region for active elements and so that a portion thereof which is directly below the fuse element to be formed is isolated from other portions of the electrically conductive layer. The pattern of the electrically conductive layer is then covered with an isolator. Subsequently, the circuit pattern inclusive of the fuse element is formed on the major surface of said semiconductor substrate. According to still another aspect of the present invention, the patterning of the electrically conductive layer may be performed so that an opening is formed in a portion thereof which is to be the region for active element, and so that a portion thereof lying directly below the fuse element to be formed is selectively removed.

In the semiconductor integrated circuit device according to the present invention, the portions of the field shield plate lying directly below the fuse element are isolated from other portions of the field shield plate. Therefore, in case of short-circuiting between the isolated field shield plate portion and the semiconductor substrate due for example to shifting or deviation in laser beam radiation at the time of severing of the fuse element, it is possible to prevent short-circuiting between the potential of the semiconductor substrate and the potential of field shield plate portions other than the isolated field shield plate portion. Also, the fuse element may be provided on a broader area of the field shield plate, so that the degree of freedom in the layout of the circuit pattern may be enhanced.

The similar operation and effect may also be used in a semiconductor integrated circuit device having such a structure in which the portions of the field shield plate lying directly below the fuse element is selectively removed.

According to the method for producing the semiconductor integrated circuit device of the present invention, a semiconductor integrated circuit device may be obtained which is of such a structure in which the portion of the field shield plate lying directly below the fuse element is isolated from the other portions of the field shield plate. In the thus produced semiconductor integrated circuit device, when a short-circuiting occurs between the isolated field shield plate portion and the semiconductor substrate due for example to deviation in the laser beam radiation at the time of severing of the fuse element, it is possible to prevent short-circuiting between the potential of the semiconductor substrate and the potential applied to the field shield plate portions other than the isolated field shield plate portion.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are a partial plan view showing a semiconductor integrated circuit device according to the present invention; FIG. 6B is a partial plan view of another aspect of this invention wherein the field shield plate portion lying directly beneath the fuse element is selectively removed.

FIGS. 7A and 7B are a cross-sectional view taken along line VII—VII in FIG. 6A; FIG. 7B is a similar cross-sectional view taken along line VII—VII in FIG. 6B.

DESCRIPTION OF THE PREFERRED EMBODIMENTS

Figure 1A:
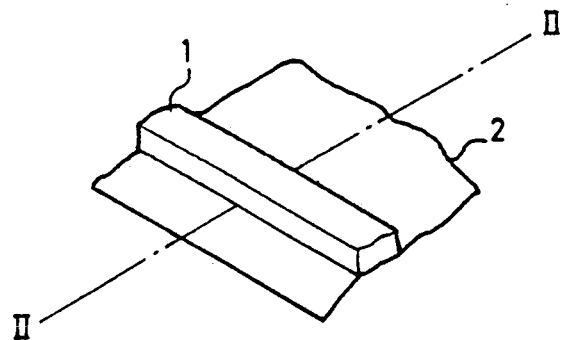
FIGS. 1a, 1B and 1C show an example of severing of the circuit pattern by laser beam irradiation in a MOS type semiconductor integrated circuit.

Referring to the drawings, certain illustrative embodiments of the present invention will be explained.

Figure 3:
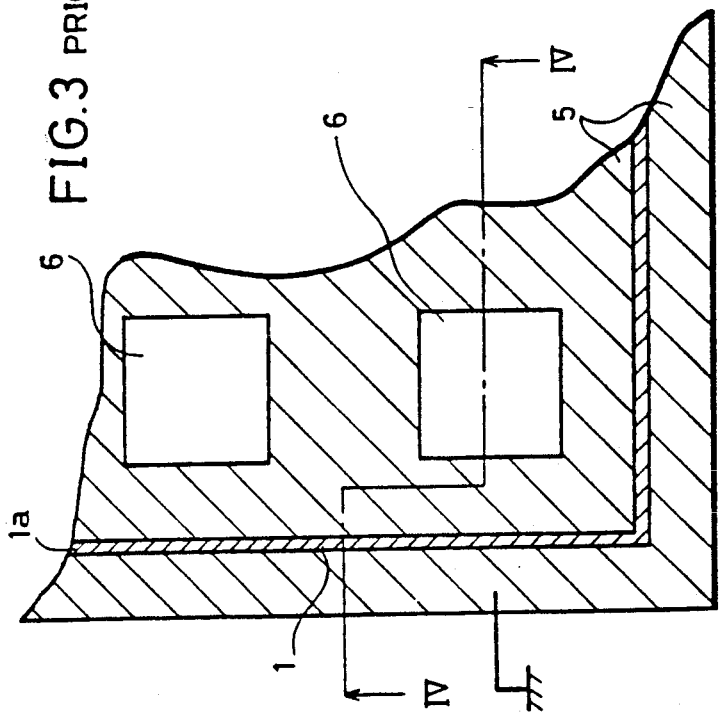
FIG. 3 is a partial plan view of the MOS IC having the gate-separating structure.
Figure 4:
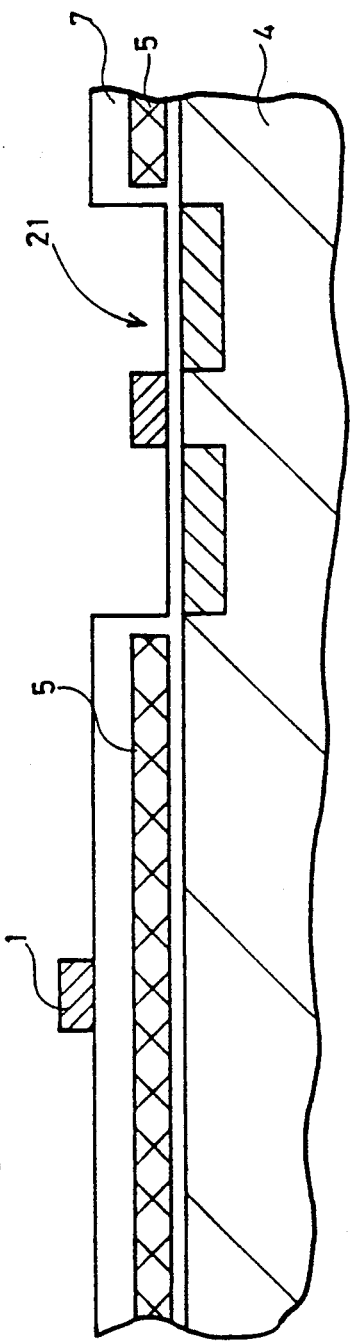
FIG. 4 is a cross-sectional view taken along line IV—IV in FIG. 3.
Figure 8:
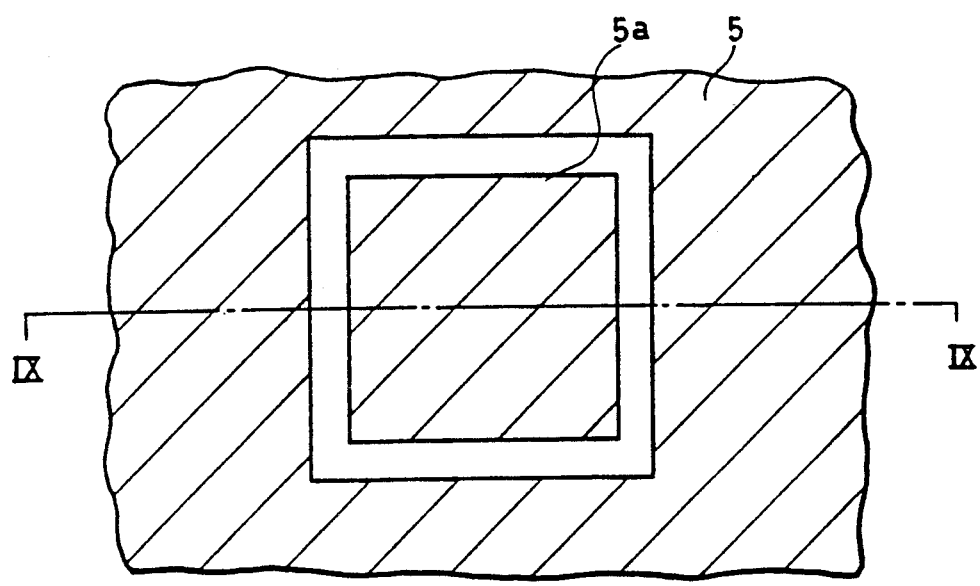
FIG. 8 is an enlarged view showing a fuse element of the semiconductor integrated circuit device of the present invention shown in FIG. 6A.

FIGS. 6A, 7A, 6B, 7B, 8 and 9A to 9C show an example of the MOS IC according to the present invention. Referring to FIG. 6A, parts or components that are the same as or equivalent to those shown in FIGS. 3 are indicated by the same reference numerals as those used in FIG. 3, and the corresponding description is omitted for simplicity. Referring to FIGS. 6A and 7A, a field shield plate portion 5a lying directly below a fuse element 1 is isolated from other field shield plate portions 5. The isolated field shield plate portion 5a is maintained at the substrate potential VBB or at a floating potential, not shown. The film thickness of the field shield plate is preferably selected to be within the range of 1500 to 2000 Å. FIG. 8 is a partial plan view showing the vicinity of the fuse element 1 of FIG. 6A to an enlarged scale. The reference numeral 5 indicates the other field shield plate portion, and the reference numeral 5a indicates the isolated field shield plate portion. Referring to FIG. 8, the field shield plate portion 5 and the isolated field shield plate portion 5a are distinct from each other and the isolated field shield plate portion 5a is maintained at substrate potential VBB or at a floating potential, not shown.

Figure 5A:
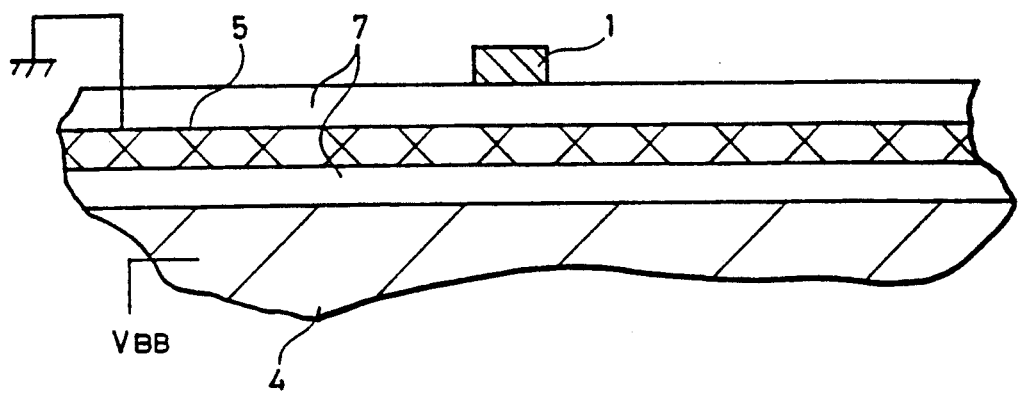
FIGS. 5A, 5B and 5C are cross-sectional views corresponding to FIGS. 1A, 1B and 1C, respectively, and showing an example of severing of the fuse element shown in FIG. 3.
Figure 5B:
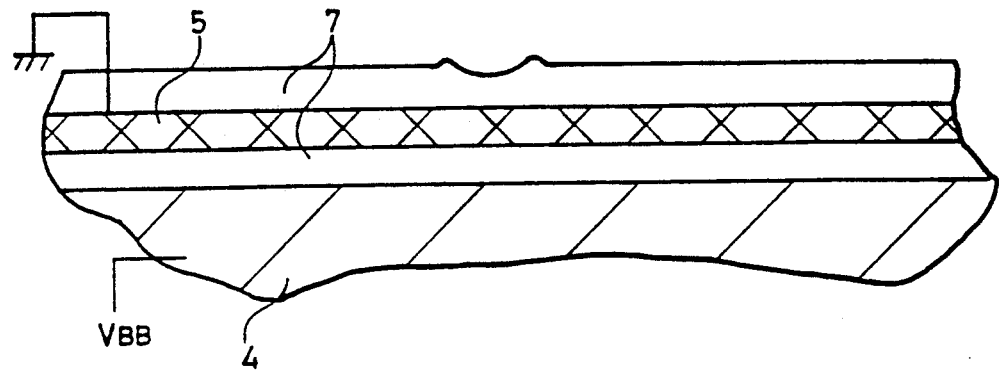
Figure 9A:
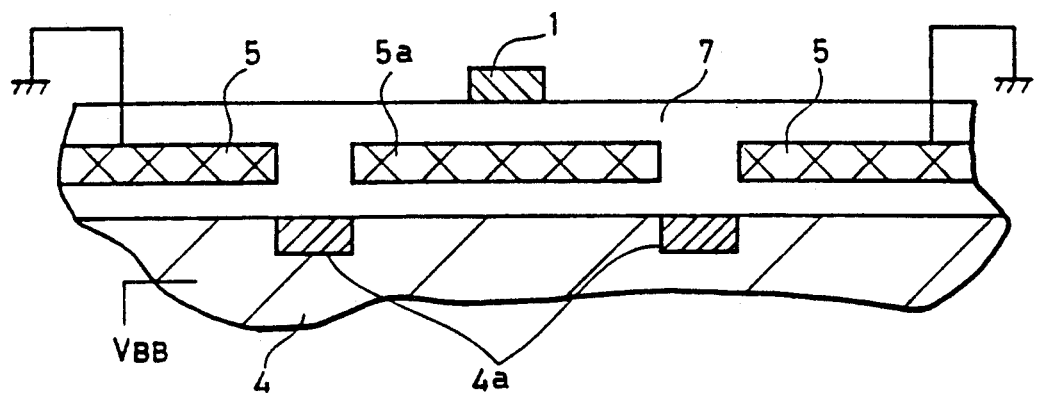
FIGS. 9A, 9B and 9C are cross-sectional views taken along line IX—IX in FIG. 8, corresponding respectively to FIGS. 1A, 1B and 1C, and showing an example of severing of the circuit pattern by the laser beam irradiation in the semiconductor integrated circuit device of the present invention.
Figure 9B:
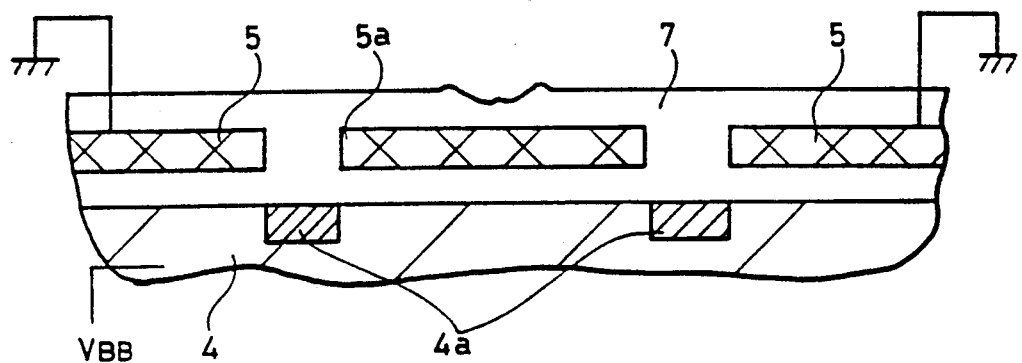
Figure 9C:
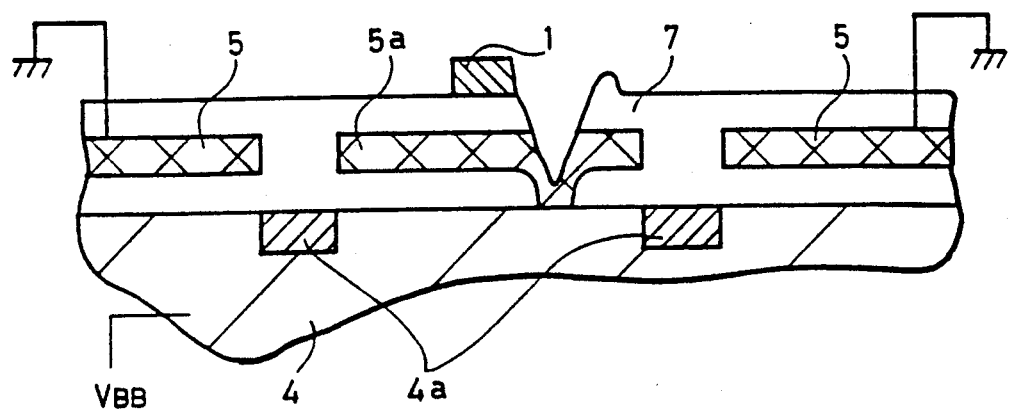

FIGS. 9A, 9B and 9C are cross-sectional views taken along line IX—IX in FIG. 8 and showing an example of severing of the fuse element by irradiation of the laser beam in the illustrative embodiment of the semiconductor integrated circuit device. In FIGS. 9a and 9c, portions or components that are the same as or equivalent to those shown in FIGS. 5A to 5C are indicated by the same reference numerals as those used in FIGS. 5A and 5C and the corresponding description is omitted for simplicity.

In FIGS. 9A to 9C, the reference numerals 4a indicates an N-type semiconductor region of higher impurity concentration which is necessarily formed in the subsequent process due to a gap formed between the field shield plate portion 5 and the isolated field shield plate portion 5a. The N-type semiconductor region of higher impurity concentration 4a is not indispensable to the present invention. The reference numeral 5a indicates the isolated field shield plate portion. This isolated field shield plate portion 5a is maintained at the substrate potential or at a floating potential, not shown.

Figure 1B:
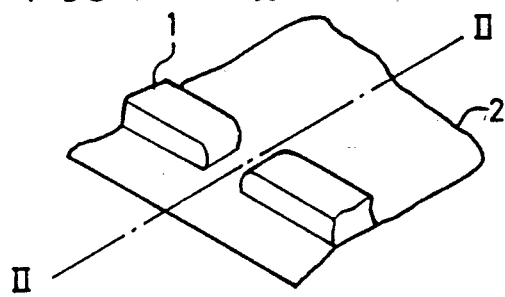
Figure 1C:
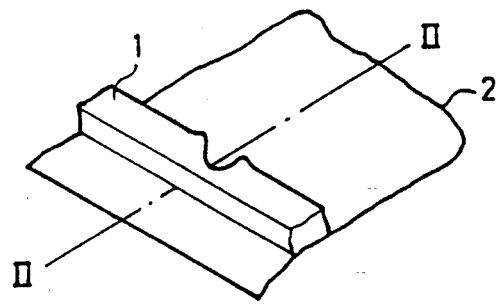
Figure 2A:
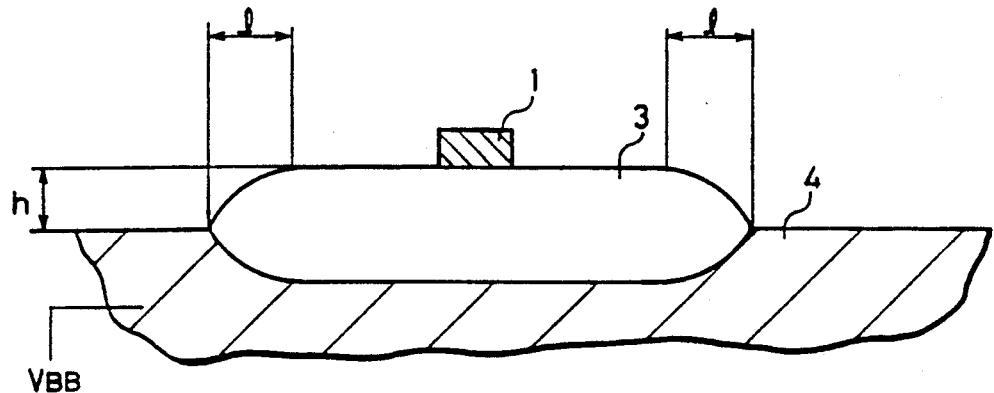
FIGS. 2A, 2B, 2C are cross-sectional views corresponding to FIGS. 1A, 1B and 1C, respectively, and showing an example of severing of the fuse element in the MOS IC in which respective elements on the MOS IC are electrically separated from one another by a LOCOS oxide film formed thereon.
Figure 2B:
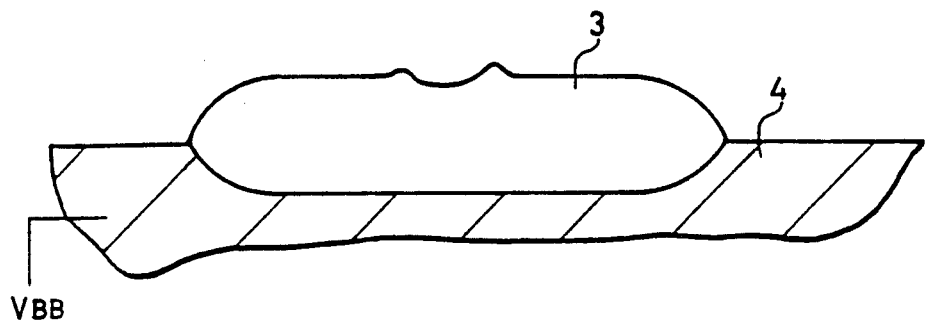
Figure 2C:
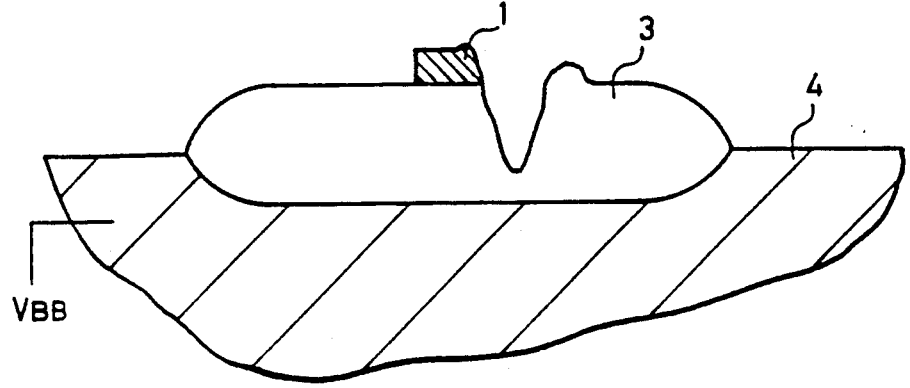

FIGS. 9A, 9B and 9C correspond in device outline to FIGS. 1A, 1B and 1C, respectively. Meanwhile, FIG. 9A shows in cross-section the vicinity of the fuse element prior to laser beam irradiation, and FIG. 9B shows in cross-section the vicinity of the fuse element after the fuse element is severed in the regular manner by laser beam irradiation. FIG. 9C shows in cross-section the vicinity of the fuse element in case of laser beam irradiation with laser beam deviation.

Figure 5C:
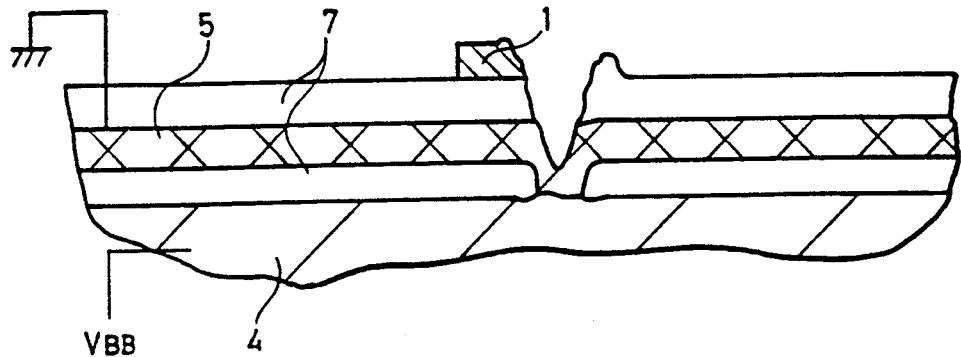

Referring to FIG. 9C, when supposing that a short-circuiting occurs between the isolated field shield plate portion 5a and the P-type semiconductor substrate 4 as a result of the laser beam irradiation with laser beam deviation, short-circuiting between the ground potential and the VBB potential as shown in FIG. 5C can not occur because the potential of the isolated field shield plate portion 5a is previously set so as to be equal to the potential VBB of the P-type semiconductor substrate 4 or to the floating potential.

Since the fuse element is provided in the semiconductor integrated circuit device of the present illustrative embodiment, circuit functions can be remedied or changed by severing the fuse element. Also, since the fuse element may be formed over a broader area of the field shield plate, the degree of freedom in the layout of the circuit pattern may be enhanced. In addition, since the respective elements are separated from one another by the gate-separating structure, it becomes possible to improve the degree of integration, as well as to flatten the surface of the semiconductor substrate.

The method for producing the MOS IC shown in FIG. 6A is hereinafter explained.

Figure 10A:
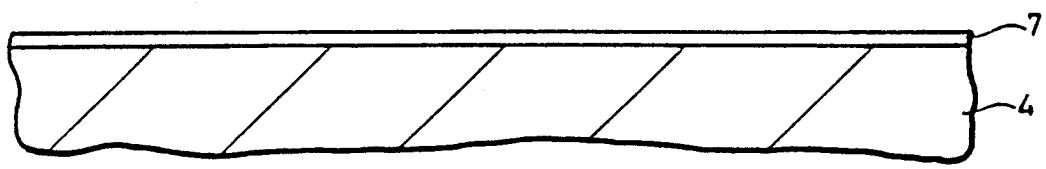
FIGS. 10a to 10F are cross-sectional views taken along line VII—VII in FIG. 6A and showing a method for producing the semiconductor integrated circuit device according to the present invention.
Figure 10B:
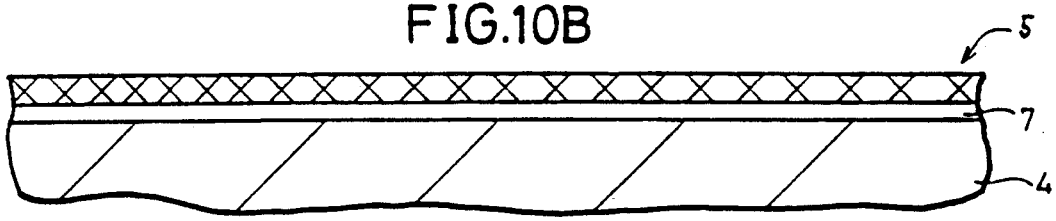

Referring to FIG. 10a, the insulating film 7 is formed on the P-type semiconductor substrate 4. Then, referring to FIG. 10B the field shield plate 5 is formed on the insulating film 7. Then, referring to FIG. 10B and 10C, the field shield plate 5 is patterned so that an opening is formed in a portion thereof which is to be the region for active element 6, and so that the portion thereof corresponding to the isolated field shield plate portion 5a directly below the fuse element to be formed is isolated from other portions thereof corresponding to the field shield plate portion 5. Then, referring to FIG. 10D, the field shield plate 5 thus patterned is coated by an insulator 7. Then, referring to FIG. 10E, a gate electrode 1b is formed in the region for active elements, and wiring pattern inclusive of the fuse element 1 is formed on the field shield plate. Then, referring to FIG. 10F, N-type impurity ions are implanted toward the major surface of the semiconductor substrate 4 to form an N-type semiconductor region of higher impurity concentration 4b in the region for active element. As a result, an MOS type transistor is formed in the region for active element. At this time, an N-type semiconductor region of higher impurity concentration 4a is concomitantly formed on the portion on the major surface of the semiconductor substrate 4 surrounding the isolated field shield plate portion 5a. This N-type semiconductor region of higher impurity concentration 4a, however, is not indispensable to the present invention.

It is noted that, in the above illustrative embodiment, the isolated field shield plate portion 5a is formed directly below the fuse element 1. This isolated field shield plate portion 5a, which plays the role as a cushion against impact and serves for flattening the substrate surface, is also not indispensable to the present invention, since the effect similar to the above illustrative embodiment may be realized when the shield plate portion 5a directly below the fuse element 1 is selectively removed in forming the MOS IC.

Although the device separation is realized in the above illustrative embodiment by solely depending upon the field shield plate, a LOCOS oxide film may also be simultaneously employed for such device separation.

Although the semiconductor substrate is the P-type semiconductor in the above illustrative embodiment, similar effects to those of the illustrative embodiment may be realized when the semiconductor substrate is the N-type semiconductor and a positive potential is applied to the field shield plate.

Although the laser beam is irradiated with laser beam deviation in the above illustrative embodiment, similar effects to those described above may also be realized when the laser beam is irradiated without deviation but with an excess output resulting in short-circuiting between the isolated field field plate portion and the semiconductor substrate.

Figure 10C:
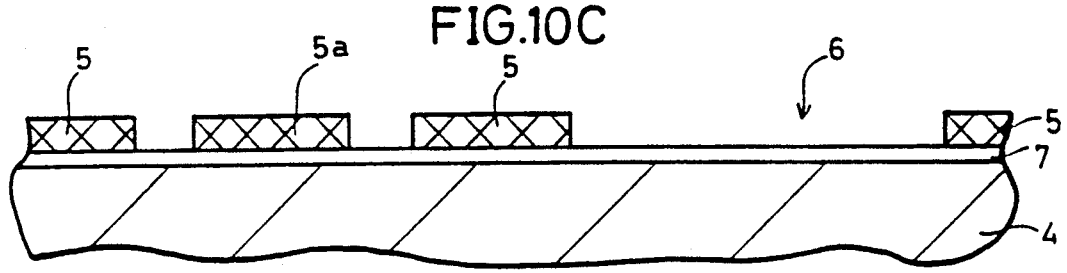
Figure 10D:
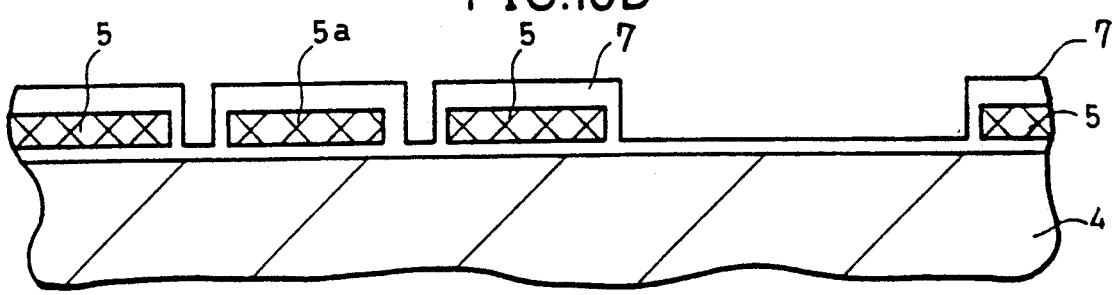
Figure 10E:
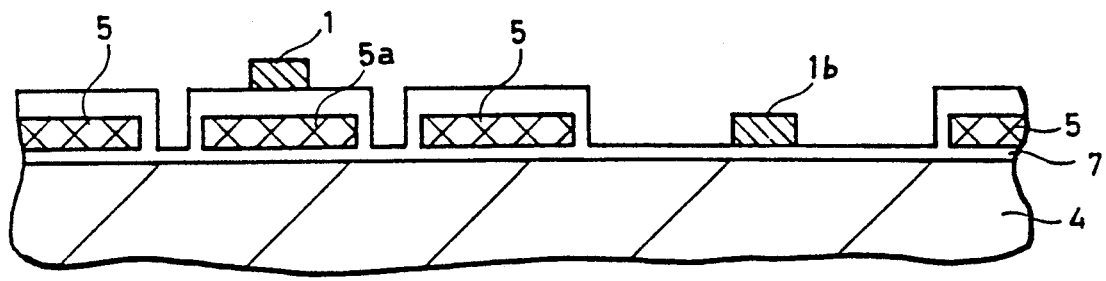
Figure 10F:
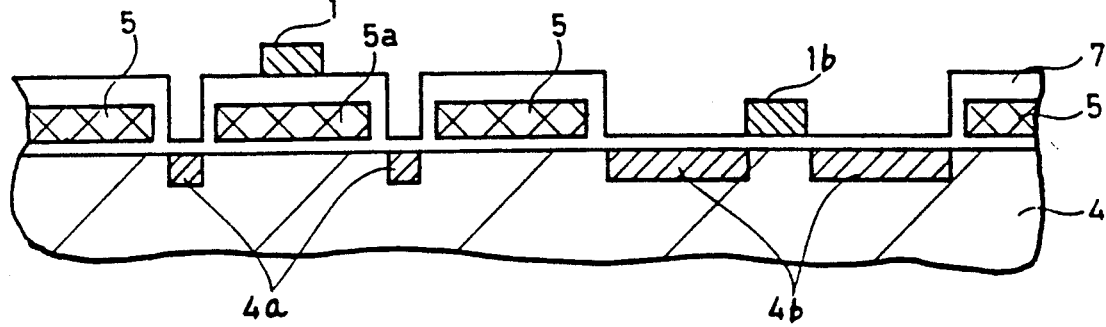

In a like manner, referring to FIGS. 10C and 10F, although the electrically conductive layer is patterned so that the isolated field shield plate portion 5a is left at a portion directly below the fuse element, similar effects may also be obtained when the electrically conductive layer is so patterned such the field shield plate portion lying directly below the fuse element is selectively removed. See FIGS. 6B and 7B.

According to the present invention, as described hereinabove, miniaturization and the surface flattening may be assisted as compared with the LOCOS type MOS IC since the element on the MOS IC are electrically separated from one another by the field shield plate. The circuit functions may also be remedied or changed by the fuse element. Although, in the present invention, the field shield plate portion lying below the fuse element is separated from other field shield plate portion, there is no risk of short-circuiting between the semiconductor substrate and the field shield plate even when the laser beam is irradiated with a laser beam deviation at the time of severing the fuse element. As a result, a MOS IC having higher reliability in structure may be produced. In addition, the degree of freedom in the circuit pattern layout may enhanced because the fuse element is provided on a broader area on the field shield plate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a semiconductor integrated circuit device in which circuit functions can be remedied or changed by severing a fuse element contained in a circuit pattern, comprising the steps of forming a thin oxide film on the major surface of a semiconductor substrate, forming an electrically conductive layer, which is to be a field shield plate, on said oxide film, patterning said electrically conductive layer so that an opening is formed at a portion thereof which is to be a region for active element, and so that a portion thereof which is directly below said fuse element to be formed is distinct and isolated from other portions of said electrically conductive layer, covering the electrical conductive layer thus formed with an isolator, and subsequently forming the circuit pattern inclusive of said fuse element on the major surface of said semiconductor substrate.

2. A method for producing a semiconductor integrated circuit device on which circuit functions can be remedied or changed by severing a fuse element contained in a circuit pattern, comprising the steps of forming a thin oxide film on the major surface of a semiconductor substrate, forming an electrically conductive layer, which is to be a field shield plate, on said oxide film, patterning said electrically conductive layer so that an opening is formed at a portion thereof which is to be a region for active element, and so that a portion thereof directly below said fuse element to be formed is selectively removed, covering the pattern of the electrically conductive layer thus formed with an isolator, and subsequently forming the circuit pattern inclusive of said fuse element on the major surface of said semiconductor substrate.

* * * * *